GLASS ULTRASONIC DELAY LINE

Filed April 9, 1969 2 Sheets-Sheet 1

INVENTORS
MASANARI MIKODA
TADASHI HIKINO
TAKAYUKI KURODA
ISAO UENO

BY Wenderoth, Lind & Ponack
ATTORNEYS

INVENTORS
MASANARI MIKODA
TADASHI HIKINO
TAKAYUKI KURODA
ISAO UENO

BY Wenderoth, Lind & Ponack
ATTORNEYS

United States Patent Office 3,598,619

Patented Aug. 10, 1971

3,598,619
GLASS ULTRASONIC DELAY LINE

Masanari Mikoda and Tadashi Hikino, Osaka-fu, Takayuki Kuroda, Hyogo-ken, and Isao Ueno, Osaka-fu, Japan, assignors to Matsushita Electric Industrial Co., Ltd., Osaka, Japan Filed Apr. 9, 1969, Ser. No. 814,587
Claims priority, application Japan, Apr. 9, 1968, 43/24,172
Int. Cl. C03c *3/04, 3/10;* H03h *7/30*
U.S. Cl. 106—53 4 Claims

ABSTRACT OF THE DISCLOSURE

An ultrasonic delay line employing glass as a delay medium. Substitution of 0.5–7.0 mole percent $PbF_2$ for part of the PbO in a glass composition consisting essentially of 68.0–77.0 mole percent of $SiO_2$, 15–23 mole percent of PbO, 0.5–3.0 mole percent of $Al_2O_3$, 0.1–2.0 mole percent of $As_2O_3$, and 6.5–9.0 mole percent of $K_2O$ produces a glass composition having acoustically stabilized properties that is suitable for a delay line medium. The glass composition has a high mechanical Q, low temperature coefficient of delay time, good acoustical stability with respect to aging, and is easy to produce.

Figure 1:
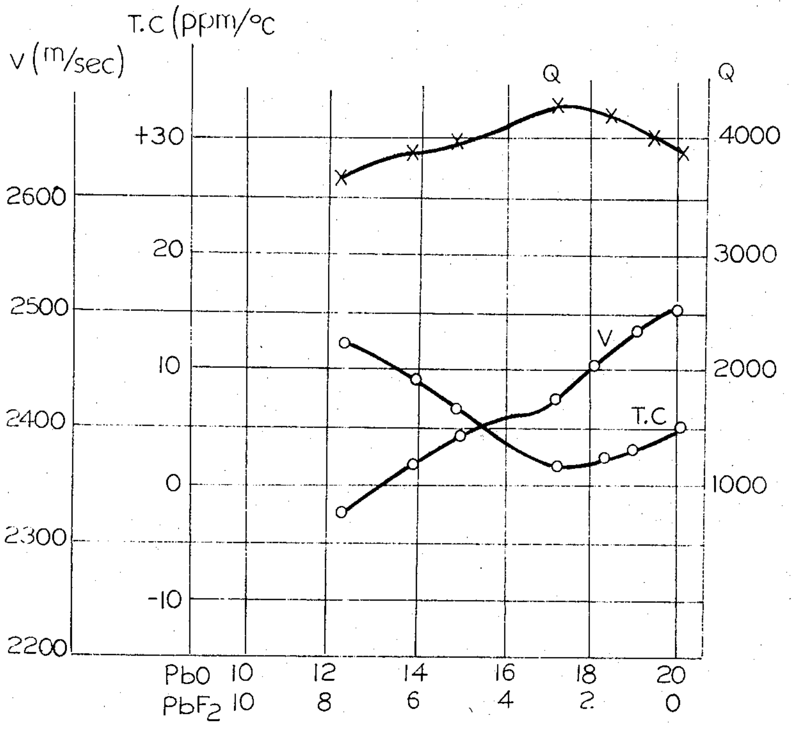

This invention relates to an ultrasonic delay line employing glass as a delay medium.

In an ultrasonic solid delay line, the electrical signal (oscillation of electric potential) to be delayed is converted into a corresponding acoustic wave and launched into a suitable solid medium. The velocity of acoustic waves in solid delay medium lies in the range of 1–6 km./s., which is lower by a factor of approximately $10^5$ than that of an electrical signal in a cable. Thus, a long delay can be obtained by using a comparatively short length path in the solid delay medium. After the acoustic wave has travelled a distance so that the vibration has undergone the required delay, it is converted back into an electrical signal.

To carry out this action, an ultrasonic delay line must consist basically of three components. The first is a transducer which converts the electrical signal into an acoustic wave. The second is the delay medium through which the acoustic wave travels and undergoes the required delay. The third is a second transducer which converts the acoustic wave back into the required signal. In an ultrasonic solid delay line, the transducers are piezoelectric transducers. A piezoelectric material undergoes a reversible strain on application of an electric field and gives rise to an electric field when it is strained. Crystalline quartz has this property and polarized ferroelectric ceramics such as barium titanate, lead zirconate titanate, and sodium-potassium niobate behave in a very similar manner.

In general, a delay medium requires a high mechanical Q and a low temperature coefficient of delay time. Fused quartz having mechanical Q approximately $10^5$ in a megacycle frequency range has enjoyed widespread use as a delay medium. However, this fused quartz is characterized by a negative temperature coefficient of time delay for shear waves that is on the order of 80 parts per millon per degree centigrade. In general, to counteract the effects of significant temperature changes, it has been necessary to package delay lines in temperature controlled cases, usually containing a heating element. The expense and inconvenience of such auxiliary packaging and heating equipment is undesirable in any application, particularly in mobile or compact equipment such as in radar systems and in color television systems.

A delay medium having a temperature coefficient of delay time of approximately zero and which is an alkali-lead-silicate glass is disclosed in U.S. Pat. 3,154,425. It is a primary purpose of the present invention to provide improved solid ultrasonic delay line employing glass as a delay medium and to provide a delay medium for such a delay line which is a glass composition.

In accordance with the invention, a solid ultrasonic delay line comprises a delay medium composed of an alkali lead fluo-oxide glass, the composition of which consists essentially of 68.0–77.0 mole percent of $SiO_2$, 15.0–23.0 mole percent of PbO, 0.5–7.0 mole percent of $PbF_2$, 0.5–3.0 mole percent of $Al_2O_3$, 0.1–2.0 mole percent of $As_2O_3$, 6.5–9.0 mole percent of $K_2O$. A preferred composition of such an alkali lead fluo-oxide glass consists essentially of 70.9–72.9 mole percent of $SiO_2$, 16–18 mole percent of PbO, 2.0–4.0 mole percent of $PbF_2$, 1–2 mole percent of $Al_2O_3$, 0.6–1.4 mole percent of $As_2O_3$, 6.5–7.5 mole percent of $K_2O$. It has been found that, as compared to a conventional alkali-lead-silicate glass, compositions containing fluorine ions instead of oxygen ions have lower processing temperatures, smaller temperature coefficients of delay time, a smaller velocity of propagation of shear wave at mega-cycle ranges and a higher Q, which is the reciprocal value of tan $\delta$ where $\delta$ is the phase angle between the mechanical shear stress and the mechanical deformation, that is, the shear angle at a frequency far below the mechanical resonant frequency of the delay member. It has further been found that the small amount of alumina increases the stability of the delay time in the glass containing fluorine ions. An acoustically stabilized glass can be prepared by using $As_2O_3$ together with $KNO_3$ as a starting material for the $K_2O$ in the glass, due to a decrease in the ionization of lead ions in the glass containing fluorine ions.

An important property of a glass which is used as a delay medium is the aging characteristic, which is a variation of delay time over the time of actual usage. Ideally, variation of delay time during usage as a delay line should approximate zero. It has been found that a glass composition containing fluorine ions instead of oxygen ions has a good stability with respect to aging at 85° C. for 1000 hours.

Figure 2:
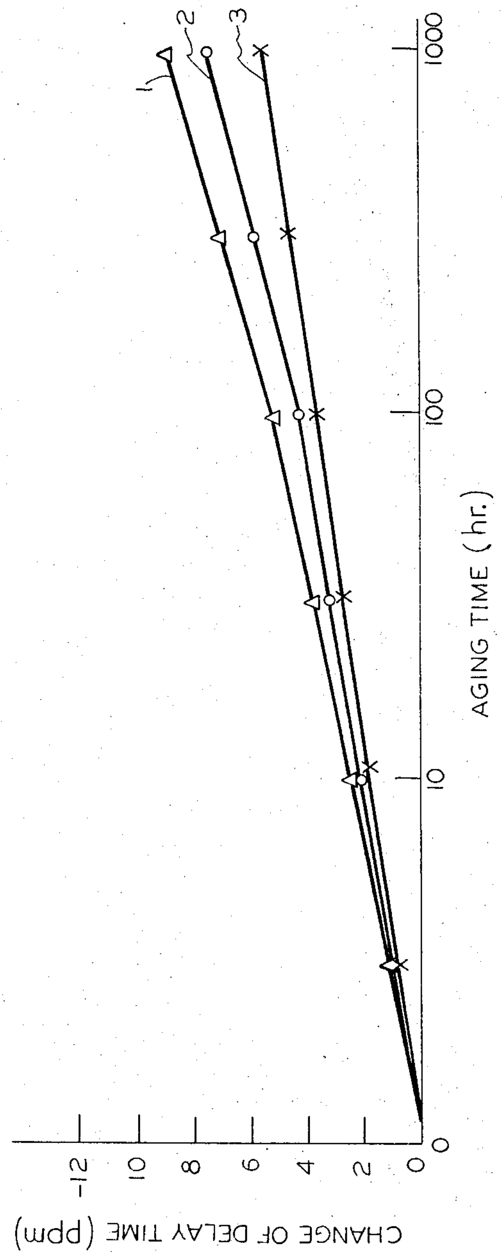

A delay line in accordance with the present invention will become apparent to those skilled in the art from the following detailed description and attached drawing in which:

FIG. 1 is a graphical illustration of the variation of the velocity of propagation of a shear wave, the temperature coefficient of delay time and mechanical Q of compositions in which $PbF_2$ has been substituted for some of the PbO therein; and FIG. 2 is a graphical illustration of the aging characteristics of the delay line according to the present invention.

A number of delay lines were made in each of which the delay medium used was a glass rod having a composition within the above-defined compositions. The glass rods used were annealed by maintaining the rods for approximately 30 minutes at an annealing temperature, and then cooling the rods at a rate of approximately 25° C. per minute. A quartz transducer was bonded on each end face of the rod with phenyl benzoate.

The following Table 1 sets forth, for more specifically illustrating the invention, the composition of certain glasses, with the elements given in mole percent as calculated from the batch composition, together with acoustic properties measured for these glasses. The most important feature and characteristic of the present invention is the effect of the substitution of fluorine ions for oxygen ions in the glass.

FIG. 1 shows the variation of the velocity of propagation of a shear wave, the temperature coefficient of delay time and mechanical Q for a glass in which $PbF_2$ has been substituted for some of the PbO in a glass system consisting of 1.5 mole percent of $Al_2O_3$, 1.0 mole percent of $As_2O_3$, $(20-x)$ mole percent of PbO, $x$ mole percent of $PbF_2$, 7.5 mole percent of $K_2O$, 70.0 mole percent of $SiO_2$.

The mechanical Q increases as the amount of $PbF_2$ increases in the glass and reaches a maximum value of 4300 at 3 mole percent of $PbF_2$ and then starts to decrease.

The velocity of propagation of the shear wave decreases as the amount of $PbF_2$ increases. The temperature coefficient of delay time decreases as the amount of $PbF_2$ increases and reaches a minimum value at about 3 mole percent of $PbF_2$ and then increases.

Temperature coefficients of delay time of the glasses used were less than ±10 p.p.m./° C. Moreover, substitution of $PbF_2$ for part of the PbO in the glass resulted in the lowering of the melting temperature and made molding of the glass easier. Temperature coefficients of delay time of the glasses containing $SiO_2$ in an amount higher than 77 mole percent, PbO in an amount higher than 23 mole percent, and $K_2O$ in an amount higher than 9.0 mole percent were less than −10 p.p.m./° C., and those of the glasses containing $SiO_2$ in an amount lower than 68 mole percent, PbO in an amount lower than 15 mole percent, and $K_2O$ in an amount lower than 6.5 mole percent were greater than +10 p.p.m./° C. To ensure that the temperature coefficient of delay time is less than ±10 p.p.m./° C., that mechanical Q is greater than 3000, and that the processing temperature is relatively low about 1300° C. and that the glass delay medium is easy to mold, the amount of $PbF_2$ in the glass should be limited to an amount in the range from 0.5 mole percent to 7.0 mole percent. Addition of 0.5 mole percent to 3.0 mole percent of $Al_2O_3$ stabilizes the acoustic properties of the fluorine-containing glass, and especially causes the glass to decrease attenuation of the shear wave and also to minimize the change of delay time during aging. The glass containing $PbF_2$ and used as a delay medium must have added thereto 0.1 mole percent of 2.0 mole percent of $As_2O_3$ to stabilize the acoustic properties of the glass, and the $K_2O$ in the glass should be introduced in the form of $KNO_3$ as a starting material.

FIG. 2 shows the aging characteristics of the glasses shown in Table 1.

The changes of delay time of the glass delay medium of the present invention during aging test at 85° C. for 1000 hours were less than 10 parts per million.

The present invention thus shows that the better acoustic properties of the glass are available by substitution of fluorine ions for part of the oxygen ions in the glass.

TABLE I

| | 1 | 2 | 3 |
|---|---|---|---|
| Composition (mole percent): | | | |
| $SiO_2$ | 69.0 | 72.0 | 71.9 |
| PbO | 17.5 | 15.5 | 16.0 |
| $PbF_2$ | 4.0 | 3.2 | 3.0 |
| $K_2O$ | 8.0 | 7.0 | 6.6 |
| $Al_2O_3$ | 1.0 | 1.5 | 1.5 |
| $As_2O_3$ | 0.5 | 0.8 | 1.0 |
| Temperature coefficient of delay time ($10^{-6}$/° C.) | 1.3 | 1.2 | 0.8 |
| Mechanical quality factor Q | 3,900 | 4,300 | 4,700 |

What is claimed is:

1. An acoustic delay line comprising a delay medium which is a glass having a composition consisting essentially of:

| | Mole percent |
|---|---|
| $SiO_2$ | 68.0–77.0 |
| PbO | 15.0–23.0 |
| $PbF_2$ | 0.5–7.0 |
| $Al_2O_3$ | 0.5–3.0 |
| $As_2O_3$ | 0.1–2.0 |
| $K_2O$ | 6.5–9.0 |

2. An acoustic delay line as claimed in claim 1, wherein the glass has a composition consisting essentially of:

| | Mole percent |
|---|---|
| $SiO_2$ | 70.9–72.9 |
| PbO | 16.0–18.0 |
| $PbF_2$ | 2.0–4.0 |
| $Al_2O_3$ | 1.0–2.0 |
| $As_2O_3$ | 0.6–1.4 |
| $K_2O$ | 6.5–7.5 |

3. A glass-type delay medium for an acoustic line having a composition consisting essentially of:

| | Mole percent |
|---|---|
| $SiO_2$ | 68.0–77.0 |
| PbO | 15.0–23.0 |
| $PbF_2$ | 0.5–7.0 |
| $Al_2O_3$ | 0.5–3.0 |
| $As_2O_3$ | 0.1–2.0 |
| $K_2O$ | 6.5–9.0 |

4. A glass-type delay medium as claimed in claim 3 wherein the glass-type delay medium has a composition consisting essentially of:

| | Mole percent |
|---|---|
| $SiO_2$ | 70.9–72.9 |
| PbO | 16.0–18.0 |
| $PbF_2$ | 2.0–4.0 |
| $Al_2O_3$ | 1.0–2.0 |
| $As_2O_3$ | 0.6–1.4 |
| $K_2O$ | 6.5–7.5 |

References Cited

UNITED STATES PATENTS

| | | | |
|---|---|---|---|
| 2,367,871 | 1/1945 | Kalsing et al. | 106—53 |
| 2,393,448 | 1/1946 | Armistead, Jr. | 106—53 |
| 3,154,425 | 10/1964 | Hoover et al. | 106—53 |
| 3,173,780 | 3/1965 | Hoover | 106—53X |
| 3,421,916 | 1/1969 | Mikoda et al. | 106—53 |

TOBIAS E. LEVOW, Primary Examiner

M. L. BELL, Assistant Examiner

U.S. Cl. X.R.

333—30